United States Patent
Yamazaki

(10) Patent No.: US 6,660,574 B1
(45) Date of Patent: Dec. 9, 2003

(54) METHOD OF FORMING A SEMICONDUCTOR DEVICE INCLUDING RECOMBINATION CENTER NEUTRALIZER

(75) Inventor: Shunpei Yamazaki, Tokyo (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 08/171,769

(22) Filed: Dec. 22, 1993

Related U.S. Application Data

(63) Continuation of application No. 07/885,643, filed on May 19, 1992, now abandoned, which is a division of application No. 07/707,178, filed on May 24, 1991, now Pat. No. 5,142,344, which is a continuation of application No. 07/520,756, filed on May 9, 1990, now abandoned, which is a division of application No. 07/153,477, filed on Feb. 3, 1988, now Pat. No. 4,959,700, which is a continuation of application No. 06/735,697, filed on May 20, 1985, now abandoned.

(30) Foreign Application Priority Data

May 18, 1984 (JP) .......................... 59-100250
May 18, 1984 (JP) .......................... 59-100251
May 18, 1984 (JP) .......................... 59-100252

(51) Int. Cl.$^7$ .............................. H01L 21/00
(52) U.S. Cl. ................. 438/164; 438/491; 438/151
(58) Field of Search ................ 437/41, 173, 101, 437/21, 909; 438/149, 151, 491

(56) References Cited

U.S. PATENT DOCUMENTS

| | | |
|---|---|---|
| 2,882,243 A | 4/1959 | Milton |
| 2,971,607 A | 2/1961 | Caswell |
| 3,304,469 A | 2/1967 | Weimer ................. 357/59 |
| 3,426,422 A | 2/1969 | Deal |
| 3,462,422 A | 2/1969 | Deal |
| 3,785,122 A | 1/1974 | Yatsurugi et al. |

(List continued on next page.)

FOREIGN PATENT DOCUMENTS

| | | | |
|---|---|---|---|
| JP | 51-1389 | 1/1976 | |
| JP | 54-158190 | 12/1979 | |
| JP | 55-11329 | 1/1980 | |
| JP | 55-13939 | 1/1980 | |
| JP | 55-29154 | 3/1980 | |
| JP | 55-78524 | 6/1980 | |
| JP | 53-152887 | 6/1980 | |
| JP | 135972 | * 10/1981 | .......... 148/DIG. 91 |

(List continued on next page.)

OTHER PUBLICATIONS

G. yaron & L.D. Hess "Application of Laser Annealing Techniques to Increase Channel Mobility in Silicon on Sapphire Transistors" Appl. Phys. Lett. 36(3), Feb. 1, 1980 pp. 220–222.*

(List continued on next page.)

*Primary Examiner*—John F. Niebling
*Assistant Examiner*—Stacy Whitmore
(74) *Attorney, Agent, or Firm*—Nixon Peabody LLP; Jeffrey L. Costellia

(57) ABSTRACT

A method of forming a semiconductor device wherein treatment gate insulating layer is formed such that its edges extend beyond edges of a gate electrode. Specifically, the method includes the steps of forming a non-single crystalline semiconductor layer on an insulating surface, forming a gate electrode on the semiconductor layer with a gate insulating layer formed therebetween, doping portions of the semiconductor layer with an impurity to form source and drain regions, and exposing the doped portions with light to crystallize the portions and activate the dopant. Since the gate electrode extends beyond the edges of the gate electrode, the doping of the portions of the semiconductor layer and the exposure to light irradiation is carried out through a part of the gate insulating layer.

6 Claims, 4 Drawing Sheets

U.S. PATENT DOCUMENTS

| | | | |
|---|---|---|---|
| 3,982,912 A | 9/1976 | Yatsurugi et al. | |
| 4,064,521 A | 12/1977 | Carlson | |
| 4,072,974 A | 2/1978 | Ipri | 357/23.7 |
| 4,113,514 A | 9/1978 | Pankove | 148/187 |
| 4,196,438 A | 4/1980 | Carlson | 148/DIG. 1 |
| 4,220,483 A | 9/1980 | Cazcarra | |
| 4,226,898 A | 10/1980 | Ovshinsky et al. | |
| 4,239,554 A | 12/1980 | Yamazaki | 357/30 |
| 4,272,880 A | 6/1981 | Pashley | 357/59 E |
| 4,337,902 A | 7/1982 | Shinada et al. | 29/571 |
| 4,353,085 A | 10/1982 | Sakurai | 357/59 |
| 4,377,902 A | 3/1983 | Shinada et al. | |
| 4,406,709 A | 9/1983 | Celler | 29/576 B |
| 4,409,805 A | 10/1983 | Wang | |
| 4,459,739 A * | 7/1984 | Shepherd et al. | 148/DIG. 122 |
| 4,463,492 A | 8/1984 | Maeguchi | 29/576 B |
| 4,464,521 A | 8/1984 | Gruber | |
| 4,470,060 A | 9/1984 | Yamazaki | 357/23.7 |
| 4,476,475 A | 10/1984 | Naem et al. | 357/23.7 |
| 4,485,146 A | 11/1984 | Mizuhashi | |
| 4,490,208 A | 12/1984 | Tanaka et al. | |
| 4,514,895 A | 5/1985 | Nishimura | 29/576 T |
| 4,520,380 A | 5/1985 | Ovshinsky et al. | |
| 4,523,368 A | 6/1985 | Fiest | 357/23.7 |
| 4,549,889 A | 10/1985 | Yamazaki | |
| 4,591,892 A | 5/1986 | Yamazaki | |
| 4,598,304 A | 7/1986 | Tanaka et al. | 357/2 |
| 4,619,034 A | 10/1986 | Janning | 357/23.1 |
| 4,667,217 A | 5/1987 | Janning | 357/4 |
| 4,710,786 A | 12/1987 | Ovshinsky et al. | |
| 4,727,044 A * | 2/1988 | Yamazuki | 437/907 |
| 4,766,477 A | 8/1988 | Nakagawa et al. | 357/59 |
| 4,888,305 A | 12/1989 | Yamazaki et al. | |
| 4,959,700 A * | 9/1990 | Yamazaki | 357/23.7 |
| 5,043,772 A | 8/1991 | Yamazaki | |
| 5,349,204 A | 9/1994 | Yamazaki | |
| 5,521,400 A | 5/1996 | Yamazaki | |
| 5,543,636 A | 8/1996 | Yamazaki | |

FOREIGN PATENT DOCUMENTS

| | | |
|---|---|---|
| JP | 56-135968 | 10/1981 |
| JP | 57-013777 | 1/1982 |
| JP | 57-110356 | 7/1982 |
| JP | 57-146561 | 8/1982 |
| JP | 57-146562 | 8/1982 |
| JP | 57-182546 | 10/1982 |
| JP | 58-27364 | 2/1983 |
| JP | 58-28873 | 2/1983 |
| JP | 58-92218 | 6/1983 |
| JP | 58-93277 | 6/1983 |
| JP | 58-155774 | 9/1983 |
| JP | 58-192379 | 11/1983 |
| JP | 58-206121 | 12/1983 |
| JP | 59-35423 | 2/1984 |
| JP | 59-35488 | 2/1984 |
| JP | 57-228158 | 7/1984 |
| JP | 59-115574 | 7/1984 |
| JP | 60-96391 | 9/1994 |

OTHER PUBLICATIONS

T.I. Kamins & P.A. Pianetta "MOSFETs in Laser–Recrystallized Poly–Silicon on Quartz" IEEE Elect. Dev. Lett. EDL–1, No. 10, Oct. 1980 pp. 214–216.*

R.A. Lemons, et al. "Laser Crystallization of Si Films on Glass" Appl. Phys. Lett. vol. 40, No. 6, Mar. 15, 1982 pp. 469–471.*

G. yaron & L.D. Hess "Application of Laser Annealing Techniques To Increase Channel Mobility In Silicon On Sapphire Transistors"Appl. Phys. Lett 36 (3), 1 Feg. 1980 pp. 220–222.

T.I. Kamins & P.A. Pianetta "MOSFETS IN Laser–Recrystallized Poly–Silicon In Quarts "IEEE Elect. Dev. Lett. EDL–1, No. 10, Oct 1980 pp. 214–216.

R.A. Lemons, et al. "Laser Crystallization of Si Films On Glass" Appl. Phys. Lett. vol. 40, No. 6, Mar. 15, 1982, pp. 469–471.

Decision on Petition No. 00–127; Date Feb. 26, 2001.

Extended Abstracts (The 26th Spring Meeting) The Japan Society of Applied... pp. 326/30P–S–18; Jan. 1, 1979 (Hayama/Matsumura).

"*Silicon Source Gases for Chemical Vapor Deposition, Solid State Technology*" May 1989, pp. 143–147.

"Physics of Semiconductor Devices" S.M. Sze IEEE Electro Device Letters pg. 32 (1981).

Preliminary Amendment to Divisional Application 08/425, 455 Filed Jun. 7, 1995.

Decision on Petition No. 00–127; Date Feb. 26, 2001.

Extended Abstracts (The $26^{th}$ Spring Meeting) The Japan Society of Applied... pp. 326/30P–S–18; Jan 1, 1979 (Hayama/Matsumura).

"*Silicon Source Gases for Chemical Vapor Deposition, Solid State Technology* " May 1989, pp. 143–147.

Exhibit D, Sanyo AM14408 cross–sectional diagram and concentrations.

Expert Report of Morgan.

Expert Report of Stephen Smith.

Expert Report of Anthony Catalano.

Expert Report of Dr. John T. Davies.

Expert Report of Dr. Bruce E. Deal.

Expert Report of Stephen J. Fonash.

Expert Report of Arthur Jonath.

Initial Expert Report of Harry F. Manbeck, Jr.

First Supplemental Expert Report of Harry F. Manbeck, Jr.

Second Supplemental Expert Report of Harry F. Manbeck, Jr.

Expert Report of Jan E. A. Maurits.

Initial Expert Report of Bernard S. Meyerson.

Expert Report of Douglas Ruthven.

Expert Report of D. Warren Vidrine.

Expert Report of Christopher R. Wronski.

Second Declaration by Dr. Yamazaki.

Notice of Samsung's Motion for Summary Judgment Declaring U.S. Patent No. 5,543,636 Invalid For Failure To Enable.

Defendant's Motion for Summary Judgment Declaring U.S. Patent No. 5,543,636 Invalid For Failure To Enable.

Memorandum In Support Of Defendants' Motion For Summary Judgment Declaring U.S. Patent 5,543,636 Invalid For Failure To Enable.

Semiconductor Energy Laboratory, Co., Ltd.'s Memorandum In Opposition To Defendants' Motion For Summary Judgement Declaring U.S. Patent No. 5,543,636 Invalid For Failure To Enable.

Defendant' Reply in Support Of Motion For Summary Judgment Declaring U.S. Patent No. 5,543,636 For Failure To Enable.

Declaration of Dr. Shunpei Yamazaki.

Memorandum In Support Of Samsung's Motion For Summary Judgment Declaring U.S. Patent 5,543,636 Invalid As Obvious Under 35 U.S.C. 103.

Memorandum In Support Of Defendants' Motion For Summary Judgment Declaring U.S. Patent 5,543,636 Invalid for Failure To Disclose Best Mode.
Notice Of SEL's Motion For Summary Judgment Dismissing Samsung's Inequitable Conduct Defense To The '636 Patent.
Motion For Summary Judgment Dismissing Samsung's Inequitable Conduct Defense To The '636 Patent.
Memorandum Of Law In Support Of SEL's Motion For Summary Judgment Dismissing Samsung's Inequitable Conduct Defense To The '636 Patent.
Declaration Of Robert Cote In Support Of SEL's Motion For Summary Judgment Dismissing Samsung's Inequitable Conduct Defense To The '636 Patent.
Declaration of Gerald J. Ferguson, Jr.
Second Declaration of Gerald J. Ferguson, Jr.
Rebuttal Report of Gerald Lucovsky.
Rebuttal To Catalano Report by Dr. Magee.
Japanese Patent Document 58–209114 with English translation published Dec. 6, 1983, Japan.
Japanese Patent Document 55–50663 with English translation published Apr. 12, 1980, Japan.
Japanese Patent Document 58–127382 with English translation published Jul. 29, 1998, Japan.
Japanese Patent Document 58–28867 with English translation published Feb. 19, 1983, Japan.
Japanese Patent Document 57–91517 with English translation published Jun. 7, 1982, Japan.
Japanese Patent Document 59–75670 with English translation published Apr. 28, 1984, Japan.
Japanese Patent Document 56–108231 with English translation published Aug. 17, 1983, Japan.
Japanese Patent Document 58–197775 with English translation published Nov. 17, 1983, Japan.
Japanese Patent Document 56–91276 with English translation published Jul. 24, 1981, Japan.
Japanese Patent Document 58–206121 with English translation published Dec. 1, 1983, Japan.
Japanese Patent Document 59–35423 with English translation published Feb. 27, 1981, Japan.
Japanese Patent Document 58–2073 with English translation published Jan. 7, 1983, Japan.
Japanese Patent Document 56–80138 with English translation published Jul. 1, 1981, Japan.
Journal of Non–Crystalline Solids 66 (1984) pp. 45–50, 'Clean' a–Si:H Prepared in a UHV System, C.C. Tsai et al.
Japanese Patent Document 57–13777 with English translation published Jan. 23, 1982, Japan.
U.S. Pat. No. 4,582,395 issued Apr. 15, 1986, Morozumi.
U.S. Pat. No. 5,294,555 issued Mar. 15, 1994, Mano et al.
Supplemental Expert Report of Catalano.
Szydlo et al., "High Current Post–Hydrogenated Chemical Vapor Deposited Amorphous Silicon PIN Diodes", pp. 988–990, Jun. 1, 1992 (cited in Supplemental Expert Report of Catalano).
Kamei et al., "Deposition and Extensive Light Soaking of Highly Pure Hydrogenated Amorphous Silicon", pp. 2380–2382, Apr. 22, 1996 (cited in Supplemental Expert Report of Catalano).
First Amended Expert Report of Stephen J. Fonash.
First Supplemental Expert Report of Fonash.
Rebuttal Expert Report of Fonash.
Revised Expert Report of Ruthven.
Revised Expert Report of Maurits.
Second Supplemental Expert Report of Morgan.
First Supplemental Expert Report of Smith.
First Amended and Supplemental Expert Report of Deal.
Memorandum Opinion Published Apr. 15, 1998 of Judge T.S. Ellis, III in C.A. No. 96–1460–A attached to IDS as Exhibit C.
Applicant SEL's Motion for Reconsideration, with exhibits A–N.
Documents discussed in Judge Ellis' opinion —Japanese Patent Document 56–135968 (Canon '968) attached to IDS as Exhibit D.
Documents discussed in Judge Ellis' opinion —Partial translation of Japanese Patent Document 56–135968 (Canon '968) attached to IDS as Exhibit E.
Documents discussed in Judge Ellis' opinion —Full translation of Japanese Patent Document 56–135968 (Canon '968) attached to IDS as Exhibit F.
Documents discussed in Judge Ellis' opinion —C.C. Tsai, et al., "Amorphous Si Prepared in a UHV Plasma Deposition System", Journal on Non–Crystalline Solids, Proceedings of the Tenth International Conference on Amorphous and Liquid Semiconductors in Tokyo, vols. 59&60, pp. 731–734 (1983) attached to IDS as Exhibit G.
Documents discussed in Judge Ellis' opinion —Japanese Patent Document 59–35423 (the '423 reference) attached to IDS as Exhibit H.
Documents discussed in Judge Ellis' opinion —Japanese Patent Document 59–35488 (the '488 reference) attached to IDS as Exhibit I.
Documents discussed in Judge Ellis' opinion —U.S. Pat. No. 5,521,400 to Yamazaki (the '400 patent) attached to IDS as Exhibit J.
Documents discussed in Judge Ellis' opinion —Japanese Patent Document 58–2073 (the Sony 2073 reference) attached to IDS as Exhibit K.
Documents discussed in Judge Ellis' opinion —Presentation materials from speech by Dr. Yamazaki in Reston, Virginia in May, 1983 attached to IDS as Exhibit L.
Complete copy of transcrips from hearing, including transcripts from Mar. 17–19, 1998; Mar. 31, 1998, Apr. 1–3, 1998; Apr. 6, 1998; and Apr. 9, 1998.
Yamazaki Deposition Transcript, pp. 509–527.
Yamazaki Deposition Transcript, pp. 410–415.
D. Carlson, "The Effects of Impurities and Temperature on Amorphous Silicon Solar Cells", IEEE Technical Digest for the 1977 IEDM in Washington, D.C., pp. 214–217 (IEEE New York, 1977).
A. Delahoy and R. Griffith, "Impurities Effects In a–Si:H Solar Cells Due to Air, Oxygen, Nitrogen, Phoosphine, or Monochlorosilane in the Plasma", Journal of Applied Physics, vol. 52, No. 10, pp. 6337–6346 (1981).
P. Vanier, et al., "Study of Gap States in a–Si:H Alloys By Measurements of Photoconductivity and Spectral Response of MIS Solar Cells", American Institute of Physics, Proceedings of the International Conference on Tetrahedrally Bonded Amorphous Semicondutors, Carefree, Arizona, pp. 237–232 (1981).
P. Vanier, et al., "New Features of the Temperature Dependence of Photoconductivity in Plasma–Deposited Hydrogenated Amorphous Silicon Alloys", Journal of Applied Physics, vol. 52, No. 8, pp. 5235–5242 (1981).
A, Delahoy, et al., "Impurity Effects in a–Si:H Solar Cells", IEEE Proceedings of the 15th Photovoltaic Specialists Conference, Kissimmee, Florida, pp. 704–712 (1981).

R. Corderman, et al., "Mass Spectrometric Studies of Impurities in Silane and Their Effects on the Electronic Properties of Hydrogenated Amorphous Silicon", Journal of Applied Phyusics, vol. 54, No. 7, pp. 3987–3992 (1983), submitted Sep., 1982.

D. Carlson, et al., Quarterly Report No. 2, SERI/PR–8254–1–T2, prepared under subcontract No. XJ–9–8254, pp. i–66 (Mar. 1980).

D. Carlson, et al., Quarterly Report NO. 4, SERI/PR–0–9372–4, prepared under subcontract No. XG–0–9372–1, pp. i–33 (Nov. 1981).

The prior work of C.C. Tsai as evidenced by the document: C.C. Tsai, et al., "Amorphous Si Prepared in a UHV Plasma Deposition System", Journal on Non–Crystalline Solids, Proceedings of the Tenth Internationl Conference on Amorphous and Liquid Semiconductors in Tokyo, vols. 59&60, pp. 731–734 (1983).

The prior work of C.C. Tsai as evidenced by the "Affidavit of Chuang Chuang Tsai" submitted to the USPTO in the file wrapper of U.S. Pat. No. 5,543,636.

Z. Hirose, "Amorphous Silicon", *Nikkei Electronics* –Special Issue, pp. 163–179 (Dec. 20, 1982).

J. Lorenz, "A Survey of the Preparation, Purity and Availability of Silanes", prepared under subcontract No. CL–3–00321–01, pp. i–73 (Dec. 1983), including the references cited on pp. 15–18.

Yusa, et al., "Ultrahigh Purification of Silane for Semiconductor Silicon", Journal of the Electrochemical Society: Solid–State Science and Technology, vol. 122, No. 12, pp. 1700–1705 (1975).

Molecular sieve, zeolite and/or Zeoram documentation (SEL00217997–SEL00218001).

T. Takaishi, et al., "Changes in the Sieving Action and Thermal Stability of Zeolite a Produced by Ion–Exchange", Journal of the Chemical Society: Faraday Transactions I, part. 1, pp. 97–105 (1975).

Exhibit B, Sanyo AM1504B cross–sectional diagram and concentrations.

Exhibit C, Sanyo SA5511–46 cross–sectional diagram and concentrations.

Exhibit D, Sanyo AM1408 cross–sectional diagram and concentrations.

Exhibit E, Lockheed D1435 cross–sectional diagram and concentrations.

Exhibit F, Lockheed 1353 solar cell, cross–sectional diagram and concentrations.

D. Carlson, "Amorphous Thin Films for Terrestrial Solar Cells", D.E. Carlson, Journal of Vacuum Science Technology, vol. 20, No. 3, pp. 290–295 (Mar. 1982).

C. Magee and D. Carlson, "Investigation of the Hydrogen and Impurity Contents of Amorphous Silicon by Secondary Ion Mass Spectrometry", *Solar Cells*, vol. 2, pp. 365–376 (1980).

Aug. 29, 1985 Amendment to U.S. patent application Ser. No. 06/525,459, pp. 5 and 6.

Zeolite documentation from Union Carbide (SEC014384–SEC014387).

A. Delahoy and R. Griffity, "Impurities Effects In a–Si:H Solar Cells Due to Air, Oxygen, Nitrogen, Phosphine, or Monochlorosilane in the Plasma", Journal of Applied Physics, vol. 52, No. 10, pp. 6337–6346 (1981).

Yamazaki Deposition Transcript, p. 601, line 23 through p. 602, line 2.

Admitted prior art transistor structure, Exhibit 49 of Yamazaki Deposition. Yamazaki Deposition transcript, p. 560, lines 13–14; p. 561, lines 16–17.

W. Spear, et al., "Doping of Amorphous Silicon B Alkali Ion Implantations", Philosophical Magazine B, vol. 39, No. 2, pp. 159–165 (1979).

Exhibit G, Sharp EL865 cross–sectional diagram and concentrations.

Exhibit H, Sharp EL875 cross–sectional diagram and concentrations.

R. Kriegler, et al., "The Effect of HCl and $Cl_2$ on the Thermal Oxidation of Silicon", Journal of Electrochemical Society: Solid–State Science and Technology, pp. 388–392 (1972).

D.E. Carlson, et al., "Research on High–Efficiency, Single–Junction, Monolithic, Thin–Film a–Si Solar Cells," Subcontract Report SER/STR–211–2813.

S. Sze, "Physics of Semiconductor Devices", John Wiley & Sons, pp. 567–571 (1969).

H. Tuan, "Amorphous Silicon Thin Film Transistor and its Applications to Large–Area Electronics", Materials Research Society Symposia Proceedings, vol. 33, pp. 247–257 (1984).

Jun. 7, 1995 Preliminary Amendment to U.S. patent application Ser. No. 08/473,953, p. 5.

K. Harii et al., "Self–Alignment Type a–Si:H TFT", 27p–L–16, Extended Abstract of the Japanese Applied Physics Society (Sep. 27, 1983).

May 23, 1993 Amendment in U.S. patent application Ser. No. 07/987, 179.

C.C. Tsai, "Impurities in Bulk a–Si:H, Silicon Nitride, and at the a–Si:H/Silicon Nitride Interface", Material Research Society Symposia Proceedings, vol. 33, pp. 297–300 (1984).

H. Tuan, "Amorphous Silicon Thin Film Transistor and its Applications to Large–Area Electronics", Material Research Society Symposia Proceedings, vol. 33, pp. 247–257 (1984).

Tsai et al., "Amorphous Si Prepared in a UHV Plasma Deposition System", Journal of Non–Crystalline Solids, Proceedings of the Tenth International Conference on Amorphous and Liquid Semiconductors in Tokyo, vols. 59 & 60, pp. 731–734 (1983).

Apr. 20, 1995 Preliminary Amendment and IDS in U.S. patent application Ser. No. 08/214,494. OR Nov. 25, 1994 Amendment in U.S. patent application Ser. No. 08/214,494.

E.H. Snow, A.S. Grove, B.E. Deal; J. Appl. Phys. vol. 36, No. 5, pp. 1664–1673, Published 1965, "Ion Transport Phenomena in Insulating Films".

A.S. Grove, P. Lamond, et al.; Electro–Technology, pp. 40–43, Published 1965; "Stable MOS Transistors".

B. Yurash and B.E. Deal; J. Electrochem. Soc., 15, 1191, Published 1968; "A Method for Determining Sodium Content of Semiconductor Processing Materials".

E.H. Nicollian and J.R. Brews, MOS (Metal–Oxide–Semiconductor) Physics and Technology, Chap. 5, "Control of Oxide Charges", pp. 754–775, 1982.

P.F. Schmidt, Solid–State Tech., 26(6), 147, 1983; "Furnace Contamination and its Remedies".

S. Mayo, J. Appl. Phys., 47, 4012, 1976.

J.R. Davis, Instabilities in MOS Devices, Chap. 4, "Mobile Ions", pp. 65–81, 1981.

P.F. Schmidt and C.W. Pearce, J. Electrochem. Soc., 128, pp. 630–636, 1981; "A Neutron Activation Analysis Study of the Sources of Transition Group Metal Contamination in the Silicon Device Manufacturing Process".

R.W. Lee, J. Chem. Phys. vol. 38, No. 2, pp. 448–455, 1963; "Diffusion of Hydrogen in Natural and Synthetic Fused Quartz".

G. Hetherington and L.W. Bell, Phys. Chem. Glasses, vol. 8, No. 5, pp. 206–208, Oct. 1967; "Letter to the Editor".

R.J. Kriegler et al., J. Electrochem. Soc., 119, 388, 1972; "The Effect of HCL and $CL_2$ on the Thermal Oxidation of Silicon".

R.J. Kriegler, Proc. Semiconductor Silicon 1973, The Electrochemical Society, Princeton, N.J., p. 363, 1973.

R.R. Hoffmeister, Wright–Patterson AFB Report No. GE–EE 74–24, pp. 56–71, 1974.

S. Mayo and W.H. Evans, J. Electrochem. Soc., 124, pp. 780–785, 1977; "Development of Sodium Contamination in Semiconductor Oxidation Atmospheres at 1000° C".

B.E. Deal, Jap. J. Appl. Phys., 16(Suppl. 16–1), pp. 29–35, 1977; "Invited: New Developments in Materials and Processing Aspects of Silicon Device Technology".

H. Dersch, J. Stuke and J. Beichler; Phys. Stat. Sol.(b)105, 265, 1981 " Electron Spin Resonance of Doped Glow–Discharge Amorphous Silicon".

M. Stutzmann, et al., Phy. Rev. 32, pp 23, 1985, "Light–Induced Metastable Defects In Hydrogenated Amorphous Silicon –A Systematic Study".

J. Knights, et al., "Phys. Rev. Lett., 39, 712, 1977" pp. 279–284 (1980) "Electronic and Structural Properties of Plasma–Deposited a–Si:O:H –The Story of $O_2$".

W. Beyer and R. Fisher, Appl. Phys. Lett., 31, 850, 1977.

J. Knights, R. Street, and G. Lucovski, Journal of Non–Crystalline Solids, 35&36, 279–284, 1980.

R. B. Swaroop, "Advances in Silicon Technology for the Semiconductor Industry", Solid State Technology, 1983, pp. 111–114.

R. Crandall, D. Carlson, and H. Weakleam, Applied Physics Letters., vol. 44, pp. 200–201, 1984 " Role of Carbon in Hydrogenated Amorphous Silicon Solar Cell Degradation".

G. Scilla and G. Ceaser, Xerox Corporation Reported, "Determination on Metallic Impurities in a–Si:H by SIMS" Surface and Interface Analysis, vol. 4, No. 6, 1982.

R. Colclaser, Wiley, "Microelectronics: Processing and Device Design", 1980.

A. Delahoy and R. Griffith, Proceeding of the 15th IEEE Photovoltaics Specialists Conference, IEEE Press, pp. 704–712, 1981, "Impurity Effects In a–Si:H Solar Cells".

S. Sze, "Physics of Semiconductor Devices", Div. of John Wiley & Sons, 1981.

M. Hirose, In Hydrogenated Amorphous Silicon, Semiconductors and Semimetals Series, vol. 21, 1984.

Paesler et al., Phys. Rev. Lett., 41, 1492, 1978, "New Development in the Study of Amorphous Silicon Hydrogen Alloys: The Story of O".

Y. Matsushita et al., Jap. J. Appl. Phys. 19, L101, 1980, "A Study on Thermally Induced Mircodefects in Czochralski-Grown Silicon Crystals: Dependence on Annealing Temperature and Starting Materials".

J. Leroueille, Physics Stat. Sol. (A)67, 177, 1981, "Influence of Carbon on Oxygen Behavior in Silicon".

D. Staebler, R. Crandall, and R. Williams, "Stability Tests on p–i–n Amorphous Silicon Solar Cells", Conference Record of the 15th IEEE Photovoltaic Specialists Conference, 249–250, 1981.

H. Branz, "Hydrogen Collision Model of Light–Induced Metastability in Hydrogenated Amorphous Silicon", Solid State Communications, in Press, Sep. 1997.

S. Guha, Conference Record of the 25th Photovoltaics Specialists Conference, pp. 1017–1022, IEEE Press, 1996, "Amorphous Silicon Alloy Solar Cells and Modules Opportunities and Challenges".

D. Neamen, Semiconductor Physics and Devices, Irwin Press, 1992.

J. Pankove, Hydrogenated Amorphous Silicon, vol. 21 A,B, C,D Semiconductors and Semimetals Series, Academic Press, 1984.

B. Ali Khan and R. Pandya, "Activation Energy of Source-Drain Current in Hydrogenated and Unhydrogenated Polysilicon Thin–Film Transistors" IEEE Transactions on Electron Devices, vol. 37, No. 7, Jul. 1990.

A. Pecora et al., "Off–Current in Polycrystalline Silicon Thin Film Transistors: An Analyis of the Thermally Generated Component", Solid–State Electronics, vol. 38, No. 4, pp. 845–850, (1995)

D. Passoja et al., Some Aspects of the Structure–Properties Relationships Associated with Haze in SOS, Journal of Crystal Growth, vol. 58, 1982, pp. 44–52.

Silicon on Sapphire, Update II, Union Carbide, Bulletin 1980. F–EMG–5801–4M, 4 pages.

T.J. Donahue et al., PECVD of Silicon Epitaxial Layers, Semiconductor International, Aug. 1985, pp. 142–146.

R.P. Roberge et al., Gaseous Impurity Effects in Silicon Epitaxy, Semiconductor International, Jan. 1987, pp. 77–81.

N. Enomoto, Letter dated Oct. 15, 199, Re: Hydrogen Purity, 1 page.

S.K. Iya, Production of Ultra–High–Purity Polycrystalline Silicon, Journal of Crystal Growth, vol. 75, 1986, pp. 88–90.

L. Shive, Letter dated Apr. 25, 1983, 3 pages.

L. Williamson, Letter dated Apr. 5, 1983, Re: Polycrystalline Silicon Sample, 1 page.

Monosilane Polycrystal Boron–Free, Komatsu Electronic Metals Co., Ltd. , $SiH_4$ Material Data Sheet No. 101, 1981, 2 pages.

P.A. Taylor, Purification Techniques and Analytical Methods for Gaseous and Metallic Impurities in High–Purity Silane, Journal Crystal Growth, vol. 89, 1988, pages 28–38.

A. Yusa et al., Ultrahigh Purification of Silane for Semiconductor Silicon, Journal of the Electrochemical Society, vol. 122, No. 12, Dec. 1975, pp. 1700–1705.

G. Robertson, et al., Boron–Free Silicon Detectors, Final Report of Sep. 1984 to Jun. 1988, Wright Research and Development Center, Materials Laboratory, WRDC–TR–90–4079, Sep. 1990, pp. 121–131.

J. Maurits et al., Abstracts of the Electrochemical Society, 90–2, 1990.

J. Lorentz, A Survey of the Preparation, Purity, and Availability of Silanes, a Subcontract Report, Solar Energy Research Institute, SERI STR–211–2092, Dec. 1983, pp. 1–73.

J. Lorentz, Monosilane and Disilane: 1984 Status Report, a Subcontract Report, Solar Energy Research Institute, SERI STR–211–2575, Mar. 1985, pp. 1–34.

Silicon Source Gases for Chemical Vapor Deposition, Solid State Technology, May 1989, pp. 143–147.

R. Coderman et al., Mass Spectrometric Studies of Impurities in Silane and Their Effects on the Electronic Properties of Hydrogenated Amorphous Silicon, J. Appl. Phys., vol. 54, No. 7, Jul. 1983, pp. 3987–3992.

R. R. Coderman, Ph.D., Letter dated May 11, 1984, 4 pages.
C. Magee et al., Investigation of the Hydrogen and Impurity Contents of Amphous Silicon by Secondary Ion Mass Spectrometry, Solar Cells, vol. 2, 1980, pp. 365–376.
T. Takahashi et al., Instrumentation, 47, 3, 1976.
Metheson Gases and Equipment Catalogue, 1992.
J. Maurits, Advanced Silicon Materals Inc., 1997.
J. Maurits, Advanced Silicon Materials Inc. 1997.
P. Schmidt, Contamination–Free High Temperature Treatment of Silicon or Other Materials, J. Electrochem. Soc.: Solid–State Science and Technology, Jan. 1983, pp. 186–189.
J. Maurits et al., The Effect of Polysilicon Impurities on Minority Carrier Lifetime in CZ Silicon Crystals, 22nd IEEE Photovoltaic Specialists Conference, Oct. 1991, pp. 309–314.
Silane –Ultraplus® II $SiH_4$, Linde Union Carbide Specialty Gases Product Information, May 10, 1990, 2 pages.
Silane Specifications, Union Carbide, Revised Nov. 22, 1985, 1 page.
Polysilicon Evaluation Report, Union Carbide Corp., Mar. 19, 1985, 1 page.
J.E.A. Maurits, SOS Wafers –Some Comparisons to Silicon Wafers, IEEE Transactions on Electron Devices, vol. ED–25, No. 8, Aug. 1978, pp. 359–363.
J.E.A. Maurits, Problems and Solutions in the Preparation of SOS Wafers, Solid State Technoloty, Apr. 1977, 6 pages.
T. Deacon, Silicon Epitaxy: An Overview, Microelectronic Manufacturing and Testing, Sep. 1984, pp. 89–92.
H. Boyd, Non–Contaminating Gas Containment, Control, and Delivery Systems for VLSI–Class Wafer Fabrication, Microelectronic Manufacturing and Testing, Mar. 1984, pp. 1–6.
J. L. Briesacher et al., Gas Purification and Measurement at the PPT Level, J. Electrochem. Soc., vol. 138, No. 12, Dec. 1991, pp. 3717–3718 and 3723.
A. Homyak et al., Delivering Hydrogen to meet < 1 ppb Impurity Levels without the use of purifiers, Solid State Technology, Gas Handling and Delivery, Oct. 1995, 4 pages.
Standard Test Method for Interstitial Atomic Oxygen Content of Silicon by Infrared absorption, ASTM Designation: F 1188 –93a, pp. 395–396.
Standard Test Method for Substitutional Atomic Carbon Content of Silicon by infrared absorption, ASTM Designation: F 1391 –93, pp. 471–472.
Friedel and Ladenburg, Annalen 143, 124, 1967.
A. Stock and C, Ber. 55, 3961, 1922.
H.J. Emerleus et al., The Oxidation of the Silicon Hydrides.Part I, Imperial College, S.W. 7., Jun. 27, 1935, pp. 1182–1189.
H.J. Emeleus and K. Stewart, J. Chem. Soc. PP 1182, 1936.
W. Shockley, Transistor Electronics: Imperfections, Unipolar and Analog Transisters*, Proceedings of the I.R.E., Nov. 1952, pp. 1289–1313.
C. Magee et al., Investigation of the Hydrogen and Impurity Contents of Amorphous Silcon by Secondary Ion Mass Spectrometry*, Solar Cells, 2, 1980, pp. 365–376.
R.S. Crandall et al., Appl. Phys. Letters, 44(2), pp. 200–201, 1984.
K.A. Dumas et al., Characterization of Hem Silicon for Solar Cells, Conference Record of the 15th IEEE Photovoltaic Specialists Conference, 1981, pp. 954–958.

T. Saito et al., A New Directional Solidification Technique for Polycrystalline Solar Grade Silicon, Conference Record of the 15th IEEE Photovoltaic Specialists Conference, 1981, pp. 576–580.
T. Nozaki, Concentration and Behavior of Carbon in Semiconductor Silicon, J. Electrochemical Soc. Solid State Science, vol. 117, No. 12, Dec. 1970, pp. 1566–1568.
D.E. Carlson et al., The Effect of Fluorine on the Performance of Amprphous Silicon Solar Cells, Conference Record of the 15th IEEE Photovoltaic Specialists Conference, 1981, pp. 694–697.
T.F. Ciszek et al., Growth of Silicon Sheets from Metallurgical–Grade Silicon, Conference Record of the 15th IEEE Photovoltaic Specialists Conference, 1981, pp. 581–588.
A.E. Delahoy et al., Impurity Effects in $\alpha$–SI:H Solar Cells Due to Air, Oxygen, Nitrogen, Phosphine, or Monochiorosllane in the Plasma, Journal of Applied Physics, vol. 52, No. 10, Oct. 1981, pp. 6337–6347.
R.E. Griffith et al., Advanced Amorphous Materials for Photovoltaic Conversion, Semiannual Report, Oct. 1, 1979–Mar. 31, 1980, Department of Energy and Environment, Brookhaven National Laboratory, pp. 1–33.
A.E. Delahoy et al., Impurity Effects in $\alpha$–Si:H Solar Cells, Conference Record of the 15th IEEE Photovoltaic Specialists Conference, 1981, pp. 704–712.
P.G. LeComber et al., Electrical and Photoconductive Properties of Ion Implanted Amorphous Silicon, Journal of Non–Crystalline Solids, 35 & 36, 1980, pp. 327–332.
Charles Feldman et al., Vacuum Deposited Polycrystalline Silicon Solar Cells for Terrestrial Use, The Conference Record of the 14th IEEE Photovoltaic Specialists Conference, 1980, pp. 391–396.
J.I. Hanoka et al., A Combined Quantitative Ebic and Ion Microprobe Analysis of SiC Particles in EFG Ribbon, The Conference Record of the 14th IEEE Photovoltaic Specialists Conference, 1980, pp. 478–483.
J.I. Hanoka, et al., Efficient Polycrystalline Solar Cells Made from Low–Cost Refined Metallurgical Silicon, The Conference Record of the 13th IEEE Photovoltaic Specialists Conference, 1978, pp. 485–489.
W.E. Spear et al., Doping of Amorphous Silicon by Alkali–Ion Implantations, Philosophical Magazine B, vol. 39, No. 2, 1979, pp. 159–165.
R.A. Gibson et al., J. Non–Crystalline Solids, 35 & 36, pp. 725–730, 1980.
T.I. Kamins et al., Mosfets in Laser–RecrystallizedPolySilicon on Quartz, IEEE Electron Device Letters, vol. EDL–1, No. 10, Oct. 1980, pp. 214–216.
R.S. Sussmann et al., Laser Annealing of Glow Discharge Amorphous Silicon, J. Non–Crystalline Solids, 35 & 36, 1980, pp. 249–254.
S. Onga et al., Characterization of Polycrystalline Silicon MOS Transistors, Japanese Journal of Applied Phyusics, vol. 21, No. 10, Oct., 1982, pp. 1472–1478.
S. Yamazaki et al., An Amorphous Silicon Solar Cell Having a Converstion Efficiency of 10.50 Percent, IEEE Electron Device Letters, vol. EDL–5, No. 8, Aug. 1984, pp. 315–318.
C.C. Tsai et al.,Clean $\alpha$–Si:H Prepared in a UHV System, Journal of Non–Crystalline Solids, 66 1984, pp. 45–50,.
M. Ohnishi et al., Preparation and Photovoltaic Characteristics of $\alpha$–Si Solar Cells Produced by a Consecutive, Separated Reaction Chamber Method, Japanese Journal of Applied Physics, Vo. 21, 1982, Supplement 21-2, pp. 231–237.

O. Tsuji et al., Proceedings of the 6th International Symposium on Plasma Chemistry, vol. 3, pp. 782–786, 1983.

Y. Kuwano, et al., Preparation and Properties of Amorphous Silicon Produced by a Consecutive, Separated Reaction Chamber Method, Japanese Journal of Applied Physics, vol. 21, No. 3, Mar. 1982, pp. 413–417.

P.A. Iles et al., Effect of Impurity Doping Concentration on Solar Cell Output, 11th IEEE Photovoltaic Spec. Conf., 1982, pp. 19–24.

P. Sichanurgrist et al., Amorphous Silicon Solar Cells with Graded Boron–Doped Active Layers, Journal of Applied Physics, vol. 54, No. 11, Nov. 1983, pp. 6705–6707.

N. Szydlo et al., High Current Post–Hydrogenated Chemical Vapor Deposited Amorphous Silicon P–I–N Diodes, Applied Physics Letters, vol. 40, No. 11, Jun. 1982, pp. 988–990.

K. Katoh et al., Amorphous–Silicon Silicon–Nitride Field-Effect Transistors, Electronics Letters, vol. 18, No. 14, May 26, 1982, pp. 599–600.

M. Matsumura, (Invited) Amorphous Silicon Transistors and Integrated Circuits, Japanese Journal of Applied Physics, vol. 22, Supplement 22–1, 1983, pp. 487–491.

P.G. LeComber et al., Amorphous–SiliconField–Effect Device and Possible Application, Electronics Letters, vol. 15, No. 6, Mar. 15, 1979, pp. 179–181.

H.C. Tuan, Amorphous Silicon Thin Film Transistor and its Applications to Large Area Electronics, Materials Research, Society, Symp. Proc. vol. 33, 1984, pp. 247–257.

C.C. Tsai et al., Impurities in Bulk α–Si:H, Silicon Nitride, and at the α–Si:H/Silicon Nitride Interface, Mat. Res. Soc. Symp. Proc. vol. 33, 1984, pp. 297–300.

H. Fritzsche, Characterization of Glow–Discharge Deposited α–Sil:H, Soler Energy Materials 3 1980, pp. 447–501.

R.S. Sussmann et al., J. Non–Crystalline Solids, 35 & 36, pp. 249–254, 1980.

M. Hirose et al., Defect Compensation in Doped CVD Amorphous Silicon, Journal of Non–Crystalline Solids, 35 & 36, 1980, pp. 297–302.

J. Ishikawa et al., The Effects of Oxygen, Hydrogen and Fluorine on the Conductivity of High Purity Evaporated Amorphous Silicon Films, Journal of Non–Crystalline Solids, 45, 1981, pp. 271–281.

N.Sol et al., J. Non–Crystalline Solids, 35 & 36, p. 291, 1980.

R.G. Wolfson et al., Ion–Implanted Thin–Film Solar Cells on Sheet Silicon, IEEE Photovoltaic Specialists Conference, 1981, pp. 595–597.

D.E. Carlson, Recent Developments in Amorphous Silicon Solar Cells, Solar Energy Materials, 3, 1980, pp. 503–518.

D.E. Carlson, Amorphous Thin FilmsfFor Terrestrial Solar Cells, Journal of Vacuum Science & echnology, vol. 20, No. 3, Mar. 1982, pp. 290–295.

D.E. Carlson et al., Amorphous Silicon Solar Cells, Quarterly Report No. 4, for the period Jul. 1, 1981 to Sep. 30, 1981, Nov. 1981, pp. 1–33.

A. Yusa et al., Ultrahigh Purification of Silane for Semiconductor Silicon, J. Electrochem. Soc.: Solid–State Science and Technology, Dec. 1975, pp. 1700–1705.

S.J. Solomon, Silicon from Silane Through Plasma Deposition, Conference Record of the 15th IEEE Photovoltaic Specialists Conference, 1981, pp. 569–571.

P.E. Vanier et al., New Features of the Temperature Dependence of Photoconductivity in Plasma–Deposited Hydrogenated Amorphous Silicon Alloys, J.Appl. Phys. vol. 52, No. 8, Aug. 1981, pp. 5235–5242.

J.R. Davis et al., Silicon Solar Cells from Transition Metal Doped Czochralski and Web Crystals, Conference Record of the 12th IEEE Photovoltaic Specialists Conference, 1976, pp. 106–111.

M. Wolf et al., Silicon Fluoride Transport: Summary of Current Results and Interim Assessment, Conference Record of the 12th IEEE Photovoltaic Specialists Conference, 1976, pp. 137–145.

W.E. Spear, Doped Amorphous Semiconductors,Advances in Physics, vol. 26, No. 6, Nov. 1977, pp. 811–845.

P. Viktorovitch et al., Determination of the Electronic Density of States in Hydrogenated Amorphous Silicon (α–SiH) from Schottky Diode Capacitance–Voltageand Conductance–Voltage Measurements, Journal of Non–Crystalline Solids, 35 & 36, 1980, pp. 569–574.

C.H. Hyun et al., DLTS Response due to Localized States in Hydrogenated Amorphous Silicon, Journal of Non–Crystalline Solids, 46, 1981, pp. 221–234.

W.E. Spear et al., Electronic Properties of Substitutionally Doped Amorphous SI, Philosophical Magazine, vol. 33, No. 6, 1976, pp. 935–949.

J.R. McCormick, Preparation and Characterization of Low Cost Silicon Substrates for Epitaxial Solar Cell Applications, Proceedings of the 14th IEEE Photovoltaic Specialists Conference, 1980, pp. 298–302.

J.M. McBain, Sorption by Chabasite, Other Zeolites and Permeable Crystals, The Sorption of Gases and Vapours by Solids, Rutledge & Sons, Ltd., London, 1932, pp. 167–176.

A. Yusa et al., Ultrahigh Purification of Silane for Semiconductor Silicon, J. Electrochem. Soc.: Solid–State Science and Technology, vol. 122, No. 12, Nov. 1975, pp. 1700–1705.

T. Takahashi et al., Changes in the Sieving Action and Thermal Stability of Zeolite a Produced by Ion–Exchange, Faraday Transactions I, Journal of Physical Chemistry pt. 1, 1975, pp. 97–105.

T. Ohgushi et al., The Molecular Sieving Action of Ion–Exchanged Zeolites A, Bulletin of the Chemical Society of Japan, vol. 51, No. 2, 1978, pp. 419–421.

D.E. Carlson et al., Amorphous Silicon Solar Cell, Applied Physics Letters, vol. 28, No. 11, Jun. 1, 1976, pp. 671–673.

D.L. Staebler et al., Reversible Conductivity Changes in Discharge–Produced Amorphous, Applied Physics Letters, vol. 31, No. 4, No. 4, Aug. 15, 1977, pp. 292–294.

C.R. Wronski, The Light Induced Changes in A–Si:H Materials and Solar Cells–Wherewe are Now, MRS (to be published), 1997, 11 pages.

Kamei et al., (to be published).

T. Kamei et al., Deposition and Extensive Light Soaking of Highly Pure Hyarogenated Amorphous Silicon, Applied Physics Letters, vol. 68, No. 17, Apr. 22, 1996, pp. 2380–2382.

M. Stutzmann et al., Light–Induced Metastable Defects in Hydrogenated Amorphous Silicon: A Systematic Study, Phyusical Review B, The American Physical Society, vol. 32, No. 1, Jul. 1, 1985, pp. 23–47.

C.C. Tsai et al., Amorphous Si Prepared in a UHV Plasma Deposition System, Journal of Non–Crystalline Solids, vols. 59 & 60, 1983, pp. 731–734.

C.C. Tsai et al., The Staebler–Wronskieffect in Undoped α–SiH: Its Intrinsic Nature and the Influence of Impurities, American Institute of Physics, 1984, pp. 242–249.

B.R. Weinberger et al., AM–1 Short Circuit Currents in Small Area PIN a–SiH$_x$ Solar Cells, 16th IEEE Photovoltaic Specialists Conference, 1982, pp. 1316–1320.

R. Plattner et al., Influence of Impurities and Doping Residues on the Stability Behavior of a–SI:H and a–SIGE:HPIN Cells, 18th IEEE Photovoltaic Specialists Conference, 1985, pp. 1598–1603.

C.R. Wronski et al., Recombination Centers in Phosophorous Doped Hydrogenated Amorphous Silicon, Solid State Communications, vol. 44, No. 10, 1982, pp. 1423–1426.

G. Lucovsky, Expert Report, Semiconductor Energy Lab. Vs. Samsung, 1997.

C.W. Magee, Expert Report, Semiconductor Energy Lab. Vs. Samsung, 1997.

C.C. Tsai, M.J. Thompson and H.C. Tuan, Mat. Res. Symp. Proc. 33, 297, 1984.

C.W. Magee, J.C. Bean, G. Foti and J.M. Poate, Thin Solid Films 81, 1, 1981.

J.C. Bean, J.M. Poate, Appl. Phys. Letters, 36, 59, 1980.

G. Foti, J.C. Bean, J.M. Poate and C.W. Magee, Appl. Phys. Letters, 36, 840, 1980.

T. Yamamoto, S. Yamamoto, S. Tomita, K. Okuno, F. Soeda, Y. Murata and A. Isitani, SIMS X, ed. by A. Benninghoven, B. Hagendorf and H.W. Werner, John Wiley & Sons, Chichester, 1997.

S. Smith, Expert Report, Semiconductor Energy Lab. Vs. Samsung, 1997.

* cited by examiner

METHOD OF FORMING A SEMICONDUCTOR DEVICE INCLUDING RECOMBINATION CENTER NEUTRALIZER

This application is a Continuation of Ser. No. 07/885,643, filed May 19, 1992, now abandoned, which was a divisional of Ser. No. 07/707,178, filed May 24, 1991, now U.S. Pat. No. 5,142,344 which itself was a continuation of Ser. No. 07/520,756, filed May 9, 1990, now abandoned, which was a divisional of Ser. No. 07/153,477, filed Feb. 3, 1988, now U.S. Pat. No. 4,959,700, which was a continuation of Ser. No. 06/735,697, filed May 20, 1985, now abandoned.

BACKGROUND OF THE INVENTION

1. Field of the Invention

The present invention relates to an insulated gate field effect transistor (herein after refer to as an insulated gate FET or an FET) and its manufacturing method.

2. Description of the Prior Art

Heretofore there has been proposed an insulated gate FET of the type that it has a high resistivity semiconductor layer formed on a substrate having an insulating surface, a gate electrode formed on the semiconductor layer with a gate insulating layer sandwiched therebetween in a manner to divide the semiconductor into two as viewed from above, and N or P conductivity type source and drain regions formed in the semiconductor layer in a manner to leave a channel forming region between first and second regions on both sides of the gate electrode as viewed from above, the source and drain regions being lower in resistivity than the channel region.

The insulated gate FET of such a construction is called an N-channel type or P-channel type insulated gate FET depending upon whether the source and drain regions are the N or P conductivity type, and it operates in such a manner as follows:

When supplied with a control voltage across the source region and the gate electrode with a DC power source connected across the source and drain regions via a load, the insulated gate FET remains in the OFF state if the control voltage is lower than a certain threshold voltage when the FET is the N-channel type, or if the control voltage is higher than the threshold voltage when the FET is the P-channel type. In this case, substantially no current flow (drain current) is caused in the drain region, supplying no current to the load. In the case where the control voltage is higher than the threshold voltage when the FET is the N-channel type, or where the control voltage is lower than the threshold voltage when the FET is the P-channel type, however, a channel region of the same conductivity type as that of the source and drain regions is formed in the channel forming region to extend between the source and drain regions on the side of the gate insulating layer, and the FET is turned ON to cause the drain current to flow, feeding current to the load.

As a modification of the above insulated gate FET has been proposed such a structure that the entire region of the semiconductor layer is formed of a single-crystal semiconductor, and accordingly, the channel forming region, the first and second regions and the source and drain regions formed therein, respectively, are all formed of the single-crystal semiconductor.

With such an insulated gate FIT, however, the semiconductor layer cannot be formed on the substrate unless the substrate is made of an insulating or semi-insulating single-crystal semiconductor.

When the semiconductor layer is formed of the single-crystal semiconductor layer, especially when the channel forming region is formed of the single-crystal semiconductor, it has a smaller optical energy gap than does it when formed of a non-single-crystal semiconductor. For example, when the semiconductor layer is made of the single-crystal silicon, the optical energy gap of the channel forming region is 1.1 eV. On account of this, when the FET is in the OFF state, the drain current is small but larger than in the case where the channel forming region is formed of the non-single-crystal semiconductor.

For this reason, the abovesaid insulated gate FET is poorer in the OFF characteristic than in the case where the channel forming region is made of the non-single-crystal semiconductor.

Another modified form of the above insulated gate FET heretofore proposed has such a structure that the entire region of the semiconductor layer is formed of a non-single-crystal semiconductor doped with a recombination center neutralizer.

In the case of such an insulated gate FET, even if the substrate is not made of the insulating or semi-insulating single-crystal semiconductor, and even if the substrate is a metallic substrate which has an insulated surface, or such as a glass, ceramic, organic synthetic resin or like insulating material substrate, the semiconductor layer can be formed on the substrate. Further, since the channel forming region is made of the non-single-crystal semiconductor doped with a recombination center neutralizer, it has a larger optical energy gap than in the case where it is formed of the single-crystal semiconductor, so long as it is sufficiently doped with the recombination center neutralizer. For instance, when the semiconductor layer is formed of non-single-crystal silicon well doped with the recombination center neutralizer, the channel forming region has an optical energy gap in the range of 1.7 to 1.8 eV. In consequence, when the insulated gate FET is in the OFF state, the drain current will be markedly small, negligible as compared with that when the channel forming region is formed of the single-crystal semiconductor. Accordingly, so long as the semiconductor layer is sufficiently doped with the recombination center neutralizer, the FET will exhibit a more excellent OFF characteristic than does it when the channel forming region is made of the single-crystal semiconductor.

In the case of such an insulate gate FET having the semiconductor layer formed of the non-single-crystal semiconductor, impurity-doped regions are formed in the first and second regions, for example, by ion implantation of an N- or P-type impurity, and then the source and drain regions are formed by heat treatment for the activation of the impurity doped in the impurity-doped regions. During the heat treatment, however, the recombination center neutralizer doped in the channel forming region is diffused therefrom to the outside by the heat. Therefore, the channel forming region contains no required and sufficient amount of recombination center neutralizer, and hence has a smaller optical energy gap than the predetermined.

Accordingly, the conventional insulated gate FET with the semiconductor layer formed of the non-single-crystal semiconductor possesses an excellent OFF characteristic as compared with the case where the channel forming region is made of the single-crystal semiconductor, but the OFF characteristic is not fully satisfactory.

Moreover, in the case of the above prior art insulated gate FET of the type having the semiconductor layer formed of the non-single-crystal semiconductor since the source and drain regions are also obtained by heat treatment, the recombination center neutralizer doped therein is diffused to the outside during the heat treatment. Thus, since the source and drain regions have the same optical energy gap as that of the channel forming region, there is set up between each of the source and drain regions and the channel forming region substantially no or very small potential barrier against carriers flowing from the source or drain regions toward the channel forming region.

This is another cause of the unsatisfactory OFF characteristic of the conventional insulated gate FET which has the semiconductor layer formed of the non-single-crystal semiconductor.

Besides, when the semiconductor layer, and accordingly the source and drain regions are formed of the non-single-crystal semiconductor, they has the same degree of crystallization as that of the channel forming region and a far higher resistance than in the case where they are made of the single-crystal semiconductor. On account of this, in the conventional insulated gate FET of the type having the semiconductor layer formed of the non-single-crystal semiconductor, the speed of switching between the ON and the OFF state is lower than in the case where the source and drain regions are formed of the single-crystal semiconductor. Accordingly, this FET has the defect that its ON-OFF operation cannot be achieved at high speed.

SUMMARY OF THE INVENTION

It is therefore an object of the present invention to provide a novel insulated gate FET which is free from the abovesaid defects of the prior art.

Another object of the present invention is to provide a novel method for the manufacture of such a novel insulated gate FET.

The insulated gate FET of the present invention has also the same structure as the above-described conventional insulated gate FET. That is, it has a high resistivity semiconductor layer formed on a substrate having an insulating surface, a gate electrode formed on the semiconductor layer with a gate insulating layer sandwiched therebetween so that it separates the semiconductor layer into two as viewed from above, and N or P conductivity type source and drain regions formed in the semiconductor layer so that they define a channel forming region between first and second regions on both sides of the gate electrode as viewed from above and extend vertically from the upper surface of the first and second regions toward the substrate, the source and drain regions having a lower resistivity than that of the channel forming region.

In the insulated gate FET of the present invention, however, the semiconductor layer is formed of a non-single-crystal semiconductor doped with a required and sufficient amount of recombination center neutralizer, and accordingly, the channel forming region is also formed of such a non-single-crystal semiconductor. In the first and second regions which constitute the source and drain regions in the semiconductor layer, there are provided on the sides of the source and drain regions, respectively, crystallized regions which have a higher degree of crystallization than the channel forming region and are doped with the recombination center neutralizer.

The insulated gate FET of the present invention is identical in construction with the aforesaid conventional insulated gage FET which has the semiconductor layer formed of the on-single-crystal semiconductor, except the inclusion of the abovesaid crystallized regions in the semiconductor layer.

Accordingly, the insulated sate FET of the present invention also operates in the same manner as the aforementioned conventional FET. That is, when supplied with a control voltage across the source region and the gate electrode with the power source connected across the source and drain regions via a load, it remains in the OFF state and causes no current flow to the load if the control voltage is lower (or higher) than a certain threshold voltage, and if the control voltage is higher (or lower) than the threshold voltage, it is turned ON to cause drain current to flow, supplying current to the load.

The insulated gate FET of the present invention has also the semiconductor layer formed of the non-single-crystal semiconductor, and hence it is free from the requirement that the substrate be an insulating or semi-insulating single-crystal semiconductor, as is the case with the conventional FET of this kind.

Further, since the semiconductor layer, and consequently the channel forming region is constituted of the non-single-crystal semiconductor doped with the recombination center neutralizer, the insulated gate FET of the present invention exhibits an excellent OFF characteristic over the FET in which the channel forming region is made of the single-crystal semiconductor.

In the insulated gate FET of the present invention, however, the channel forming region is doped with a required and sufficient amount of recombination center neutralizer, as will be evident from the manufacturing method of the present invention described later. Accordingly, the channel forming region has a predetermined optical energy gap, ensuring to provide an excellent OFF characteristic as compared with that of the conventional FET which has the semiconductor layer formed of the non-single-crystal semiconductor.

Moreover, in the insulated gate FET of the present invention, the crystallized regions, which have a higher degree of crystallization than the channel forming region and are doped with the recombination center neutralizer, are formed in the first and second regions which constitute the source and drain regions, respectively, and the crystallized regions form the effective regions of the source and drain regions. On the other hand, the crystallized regions have a smaller optical energy gap than does the channel forming region. Accordingly, there is established between each of the source and drain regions and the channel forming region a potential barrier against carriers which flow from the source or drain region toward the channel forming region.

This ensures that the FET of the present invention exhibits an excellent OFF characteristic over the conventional FET which has the semiconductor layer formed of the non-single-crystal semiconductor.

Besides, in the insulated gate FET of the present invention, the crystallized regions, which constitute the effective regions of the source and drain regions, are formed in the first and second regions, as mentioned above, and the crystallized regions are far lower in resistance than in the case where the first and second regions are not crystallized. On account of this, the speed at which the FET of the present invention is switched between the ON and OFF state is higher than in the case of the prior art FET which has the semiconductor layer formed of the non-single-crystal semiconductor. In other word, the ON-OFF operation of the FET of the present invention is higher in speed than the ON-OFF operation of the conventional FET.

The insulated gate FET manufacturing method of the present invention includes the following steps.

The manufacture starts with the formation of a non-single-crystal semiconductor layer doped with the recombination center neutralizer on a substrate having an insulating surface.

Next, a gate electrode is formed on the non-single-crystal semiconductor layer with a gate insulating layer sandwiched therebetween in such a manner that the non-single-crystal semiconductor layer is separated into two as viewed from above.

Next, source and drain regions doped with N- or P-type impurity and the recombination center neutralizer are formed in first and second regions of the non-single-crystal semiconductor layer on both sides of the gate electrode, as viewed from above, in such a manner to leave therebetween a channel forming region doped with the recombination center neutralizer.

Next, the first and second regions of the non-single-crystal semiconductor layer are exposed to irradiation by light for annealing at a temperature at which the recombination center neutralizer doped in the non-single-crystal semiconductor layer does not substantially diffuse to the outside. By this, the first and second regions of the non-single-crystal semiconductor layer are crystallized to form crystallized regions on the sides of the source and drain regions. And the N-type or P-type impurity in the source and drain regions is activated. The crystallized regions have a higher degree of crystallization than the channel forming region, are doped with the recombination center neutralizer and extend vertically from the upper surface of the first and second regions toward the substrate. In this instance, it is preferable that the gate insulating layer be formed on the semiconductor layer to cover the entire area of the surface of each of first and second regions before the exposure to the light irradiation for annealing so as to prevent that the recombination center neutralizer diffuse to the outside from the source and drain regions and the crystallized regions. Further, it is preferable that the light irradiation for annealing be performed intermittently so as to prevent that the high-temperature heating of the crystallized regions by the light irradiation will cause unnecessary diffusion from the source and drain regions and the crystallized regions of the recombination center neutralizer to the outside.

With such a manufacturing method of the present invention, it is possible to easily fabricate the insulated gate FET of the present invention which possesses the aforesaid advantages.

Other objects, features and advantages of the present invention will become more fully apparent from the following detailed description taken in conjunction with the accompanying drawings.

DESCRIPTION OF THE PREFERRED EMBODIMENTS

FIGS. 1, 2, 3 and 4 illustrate first, second, third and fourth embodiments of the present invention, respectively, in which an island-shaped N$^-$-, P$^-$- or I-type non-single-crystal semiconductor layer 2 is formed, for example, 0.7 μm on, for example, a 1.1 mm thick insulating substrate 1 as of quartz glass. The non-single-crystal semiconductor layer 2 is constituted of, for instance, amorphous, microcrystalline or polycrystalline silicon. The non-single-crystal semiconductor layer 2 is doped with a hydrogen or a halogen such as fluorine, as a recombination center neutralizer in an amount of 1 atom % or more. The non-single-crystal semiconductor layer 2 is deposited over the entire area of its surface with, for example, 1000 Å thick gate insulating film 3 as of silicon nitride. A stripe-shaped gate electrode 5G, which is formed of, for example, microcrystalline or polycrystalline silicon heavily doped with an N-type impurity such as phosphorus or arsenic, is formed, for instance, 0.3 μm thick on the gate insulating film 3 in such a manner that the gate insulating film 5G separates the non-single-crystal semiconductor layer 2 into two, as viewed from above. In the non-single-crystal semiconductor layer 2 source and drain regions 5S and 5D, which are doped with an N-type impurity such as phosphorus or arsenic, are formed in regions on both sides of the gate electrode 5G in such a manner to define therebetween a channel region 5C.

Figure 1:
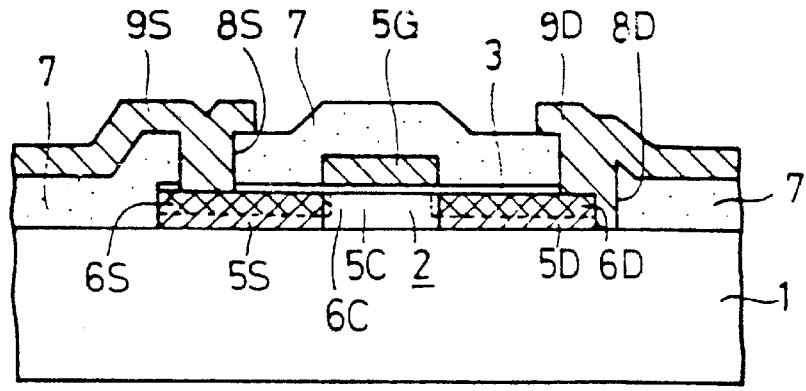
FIGS. 1, 2, 3A and 4 are sectional views schematically illustrating embodiments of the insulated gate FET of the present invention.
Figure 2:
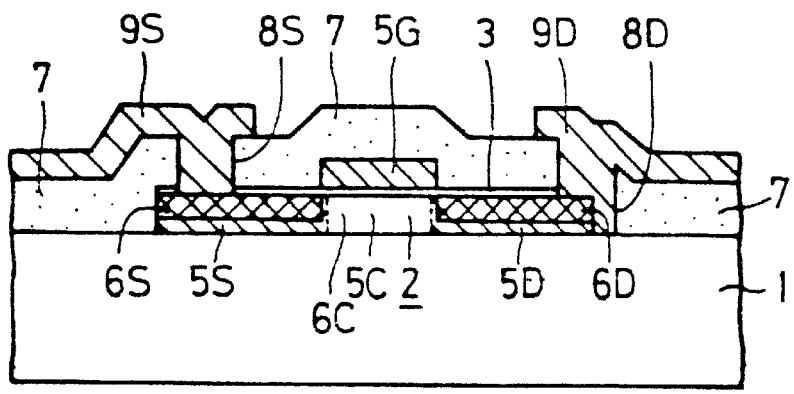
Figure 3:
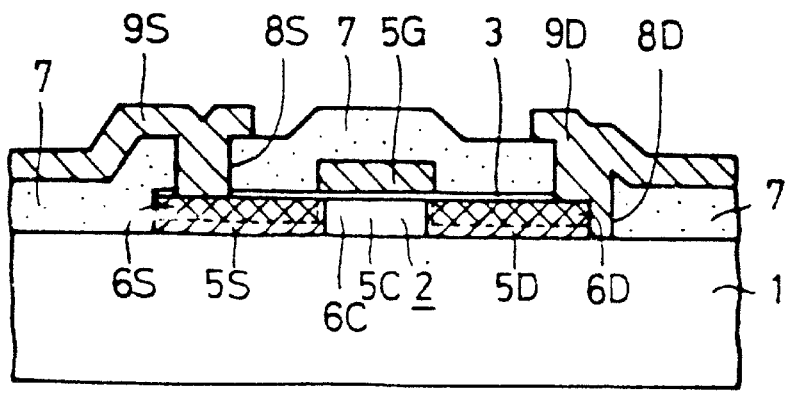
Figure 4:
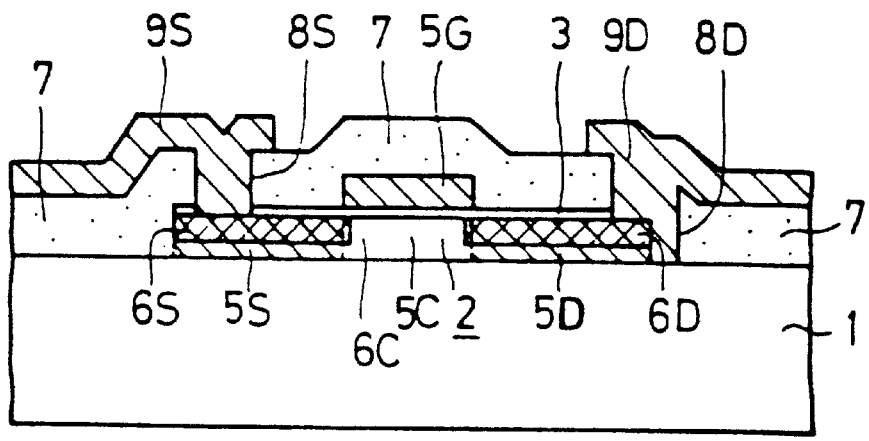

In this instance, the marginal edges of the source and drain regions 5S and 5D on the side of the channel region 5C laterally extend to positions right under the opposite marginal edges of the gate electrode 5G, as shown in FIGS. 1 and 2, or to the vicinities of the abovesaid positions, as shown in FIGS. 3 and 4. Further, the source and drain regions 5S and 5D vertically extend past the non-single-crystal semiconductor layer 2 down to the insulating substrate 1, as shown in FIGS. 1 and 3. Alternatively, the source and drain regions 5S and 5D vertically extend past the non-single-crystal semiconductor layer 2 but not down to the substrate 1, as shown in FIGS. 2 and 4.

The two regions of the non-single-crystal semiconductor layer 2 on both sides of the gate electrode 5G, as viewed from above, have formed therein crystallized regions 6S and 6D which define therebetween a non-crystallized region 6C.

In this case, when the semiconductor layer 2 is constituted of an amorphous semiconductor, the crystallized regions 6S and 6D are formed of a microcrystalline or polycrystalline semiconductor, or a mixture thereof, a mixture of the microcrystalline and/or polycrystalline semiconductor and the amorphous semiconductor, or a single-crystal semiconductor. When the semiconductor layer 2 is constituted of the microcrystalline or polycrystalline semiconductor, the regions 6S and 6D are formed of the microcrystalline, polycrystalline or single-crystal semiconductor which has a higher degree of crystallization than does the starting microcrystalline or polycrystalline semiconductor.

The crystallized regions 6S and 6D vertically extend past the semiconductor layer 2 down to the insulating substrate 1, for example, as shown in FIGS. 2 and 4. Alternatively, the regions 6S and 6D vertically extend past the semiconductor layer 2 but not down to the insulating substrate 1, as depicted in FIGS. 1 and 3. The marginal edges of the regions 6S and 6D on the side of the non-single-crystallized region 6C laterally extend across the source and drain regions 5S and 5D under the gate electrode 5G, as shown in FIGS. 1 and 2. Alternatively, the abovesaid marginal edges of the regions 6S and 6D laterally extend but not across the source and drain regions 5S and 5D, as illustrated in FIGS. 3 and 4. The insulating substrate 1 has formed thereon an insulating film 7 which covers the semiconductor layer 2, the gate insulating film 3 and the gate electrode 5G.

The insulating film 7 is covered with interconnection layers 9S and 9D which make ohmic contact with the source and drain regions 6S and 6D through holes 8S and 8D made in the insulating film 7. Further, on the insulating film 7 is formed an interconnection layer 8G (not shown) which make ohmic contact with the gate electrode 5G.

With such an insulated gate FET of the present invention as described above, when it is supplied with a control (gate) voltage across the source and gate regions 5S and 5G via the interconnection layers 8S and 8G in a state in which a DC power source (not shown) in connected across the source and drain regions 5S and 5G via a load (not shown), if the control voltage is higher than a certain threshold voltage which is negative relative to the side of the gate electrode 5G, or zero or positive, then an N-type channel which extends between the source and drain regions 5S and 5D is formed in the channel region 6C on the side of the gate insulating film 3 and a drain current is caused to flow across the drain region 5D, supplying current to the load. The insulated gate FET in which the drain current flows when the gate voltage is higher than a certain negative threshold voltage is commonly referred to as a depletion type, and in this case, the drain current flows even if the gate voltage is zero. The insulated gate FET which causes the drain current flow when the gate voltage is higher than a certain positive threshold voltage is commonly referred to as an enhancement type.

When the gate voltage is lower than the abovesaid gate voltage, the FET remains in the OFF state and causes substantially no drain current to flow.

The channel forming region 5C or non-crystallized region 6C is doped with the recombination center neutralizer in a required and sufficient amount, and the source and drain regions 5S and 5D and the crystallized regions 6S and 6D are also doped with the recombination center neutralizer.

The crystallized regions 6S and 6D constitute the effective regions of the source and drain regions 5S and SD. The regions 6S and 6D are lower in resistance than the non-crystallized region 6C. Accordingly, such an excellent OFF characteristic as referred to previously in the "Summary" can be obtained, though not described in detail, and this permits a high-speed ON-OFF operation.

Figure 5A:
FIGS. 5A to 5G are sectional views schematically illustrating a sequence of steps involved in the manufacture of the insulated gate FET of FIG. 1 according to the manufacturing method of the present invention.

FIGS. 5A though 5G illustrate the manufacturing method of the insulated gate FET of the present invention described previously in conjunction with FIG. 1. In FIG. 5, the like parts corresponding to those in FIG. 1 are identified by the same reference numerals and no detailed description thereof will be repeated.

The manufacture starts with the preparation of the same substrate 1 as mentioned previously with respect to FIG. 1 (FIG. 5A).

Figure 5B:
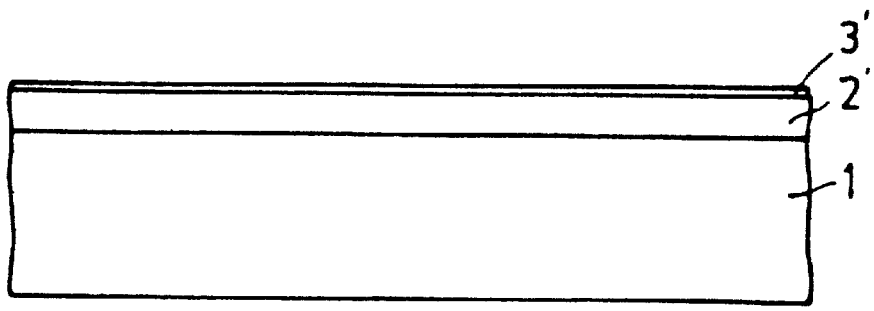

In the next step, a non-single-crystal semiconductor layer 2' which contain the recombination center neutralizer in an amount of 1 atom % or more and which will ultimately form the non-single-crystal semiconductor layer 2 and an insulating layer 3' which will ultimately form the gate insulating layer 3, are formed in that order over the entire area of the surface of the substrate 1 by means of, for example, a light plasma CVD process holding the substrate 1 at 250° C., for instance (FIG. 5B). In the formation of the semiconductor layer 2', care should be taken so that oxygen, nitrogen or carbon, which will shorten the carrier lifetime in the ultimate layer 2, is not contained therein in a large amount exceeding $5 \times 10^{18}$ atom/cm$^3$ in order to obtain a large drain current during the ON state of the ultimate FET and to prevent the introduction of a hysterisis characteristic in the gate voltage-drain current characteristic of the FET.

Figure 5C:
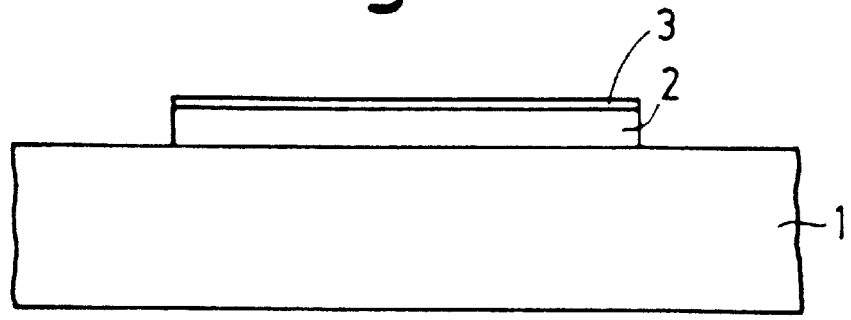

Next, the laminate member composed of the non-single-crystal semiconductor layer 2' and the insulating layer 3' is subjected to an etching process which employs a plasma obtainable at room temperature by exciting, for example, a gas mixture of $CF_4$ and oxygen at a high frequency of, for instance, 13.56 MHz. By this, the non-single-crystal semiconductor layer 2 and the insulating layer 3, described previously with respect to FIG. 1 are formed (FIG. 5C).

Figure 5D:
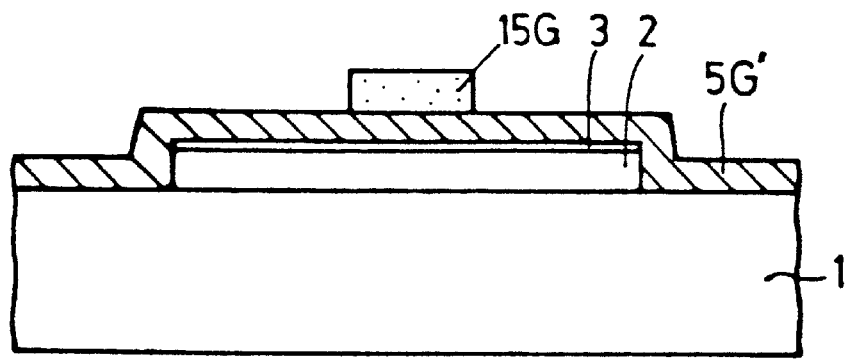

Next, a conductive layer 5G', which will ultimately form the gate electrode 5G mentioned previously with respect to FIG. 1, is formed on the substrate 1 to cover the semiconductor layer 2 and the insulating layer 3. Then a mask layer 15G as of photo resist is formed in a pattern of the gate electrode 5G on the conductive layer 5G' (FIG. 5D).

Figure 5E:
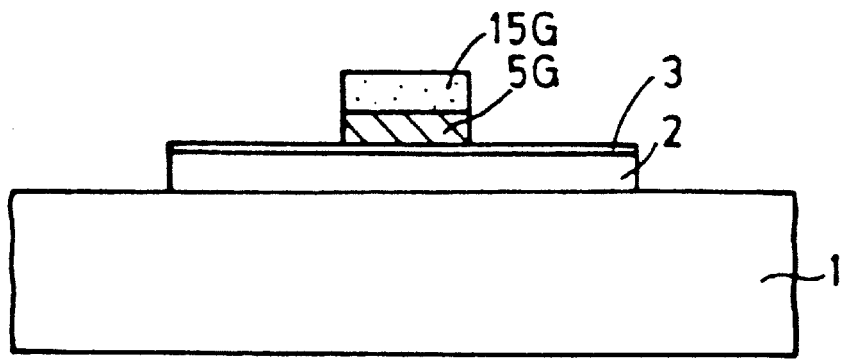

After this, the conductive layer 5G' is selectively etched away through the mask layer 15G, forming the abovesaid gate electrode 5G (FIG. 5E).

Figure 5F:
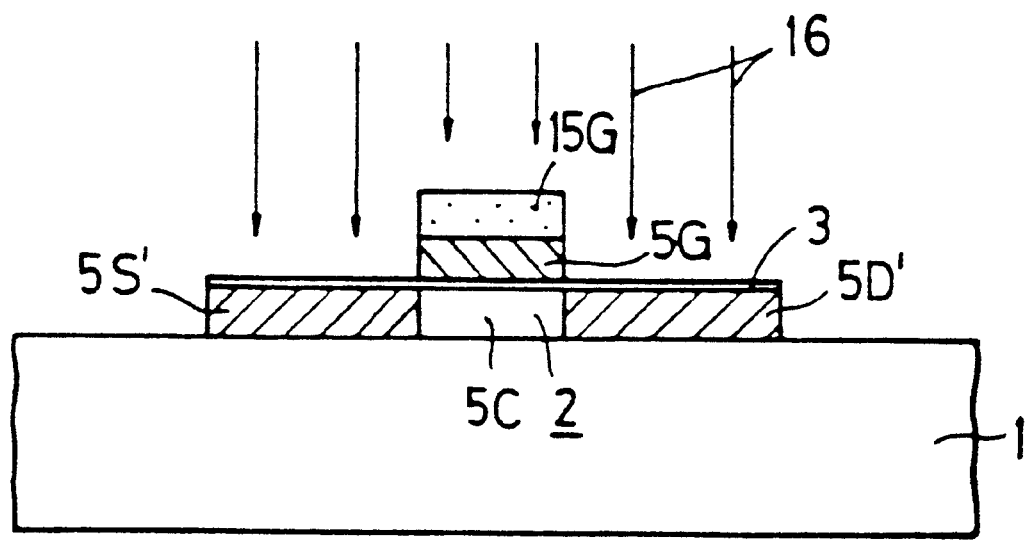

This is followed by the implantation of an N-type impurity ion, for example, a phosphorus ion, into the non-single-crystal semiconductor layer 2 using the laminate member composed of the gate electrode 5G and the mask layer 15G. By this, regions 5S' and 5D', which will form the activated source and drain regions 5S and 5D by the next step, are formed to leave therebetween the channel forming region 5C described previously in connection with FIG. 1 (FIG. 5F). In this case, the substrate 1 is held below 400° C. so that the recombination center neutralizer doped in the semiconductor layer 2 are not diffused to the outside thereof.

Figure 5G:
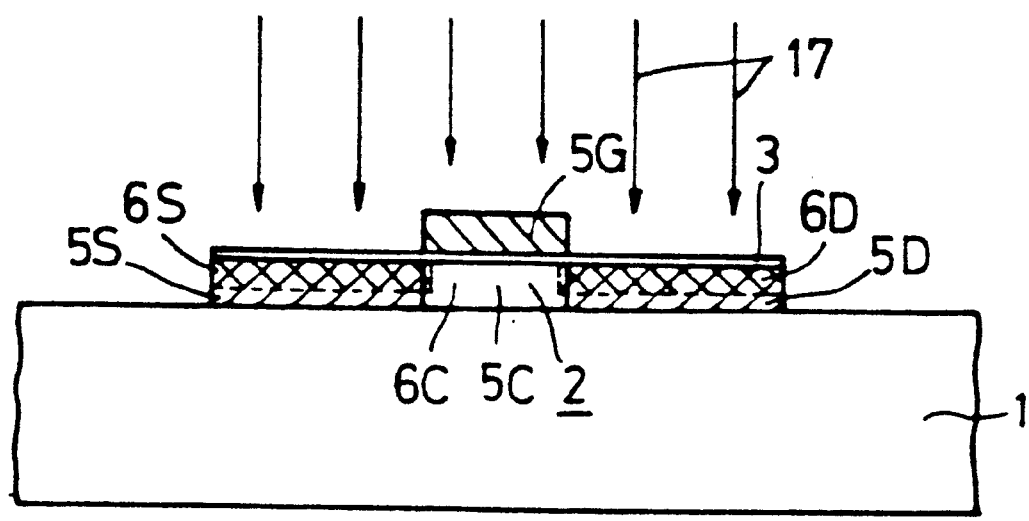

Next, the mask layer 15G is removed from the gate electrode 5G, after which the regions 5S' and 5D' are scanned all over them, together with the gate electrode 5G, for example, at a rate of 5 to 50 cm/minute, by light 17 for annealing which is obtainable with, for instance, an ultra-high mercury lamp and which has a wavelength of 250 to 600 nm, a beam diameter of 15 mm and an output of 5 KW. By this, the crystallized regions 6S and 6D mentioned previously in conjunction with FIG. 1 are formed, and at the same time, the regions 5S' and 5D' are activated, providing the ultimate source and drain regions 5S and 5D (FIG. 5G). The crystallized regions 6S and 6D thus obtained have a sheet resistance as low as $1 \times 10^2$ $(\Omega cm)^{-1}$ when the sheet resistance of the channel forming region is $4 \times 10^{-3}$ $(\Omega cm)^{-1}$. In this case, the substrate 1 is held below 400° C. so that the recombination center neutralizer doped in the semiconductor layer 2 are not diffused to the outside thereof. Further, the light irradiation may also be effected intermittently with a view to prevent the semiconductor layer 2 from being heated to such a high temperature that causes the diffusion of the recombination center neutralizer to the outside of the layer 2. In this instance, when the gate electrode 5G is a phosphorus-doped non-single-crystal semiconductor layer, its degree of crystallization is higher than that before exposure to the light irradiation.

Next, the substrate 1 is coated with the insulating film 7 as depicted in FIG. 1, and then the contact holes 8S, 8D and 8G (the hole 8G being not shown) are made in the insulating film 7. After this, the interconnection layers 9S, 9D and 9G are formed on the insulating film 7 so that they make ohmic contact with the source and drain regions 5S and 5D and the gate electrode 5G through the contact holes 8S, 8D and 8G, respectively.

In the manner described above, the insulated gate FET mentioned in connection with FIG. 1 is fabricated.

With the insulated gate FET thus obtained, according to my experiments, the drain current obtained during the ON state was as large as $1 \times 10^{-5}$ to $2 \times 10^{-5}$ (A), whereas during the OFF state it was as small as $10^{-10}$ to $10^{-11}$ (A). Further, since the crystallized regions 6S and 6D laterally extend across the source and drain regions 5S and 5D to underlie the gate electrode 5G, a high avalanche breakdown voltage can be obtained.

While the foregoing description has been given of the manufacture of the insulated gate FET of the present invention depicted in FIG. 1, it will be seen that the insulated gate FETs of the present invention shown in FIGS. 2, 3 and 4 can also be fabricated by method of the present invention similar to that described above.

It will be apparent that many modifications and variations may be effected without departing from the scope of the novel concepts of the present invention.

What is claimed is:

1. A method of forming a semiconductor device comprising the steps of:

forming a non-single crystalline semiconductor layer containing a recombination center neutralizer on an insulating surface of a substrate;

forming a gate electrode on said semiconductor layer with a gate insulating layer therebetween;

doping portions of said semiconductor layer with an impurity to form source and drain regions; and exposing said portions to light irradiation in order to crystallize said portions or activate dopant impurities contained therein;

wherein said gate insulating layer extends beyond an edge of said gate electrode and covers said portions of the semiconductor layer, and the doping of said portions and the exposure of said portions to light irradiation are carried out through a part of said gate insulating layer located on said portions.

2. The method of claim 1 wherein said exposing is performed by using an ultra high pressure mercury lamp.

3. A method of forming a semiconductor device comprising the steps of:

forming a non-single crystalline semiconductor layer containing a recombination center neutralizer on an insulating surface of a substrate;

forming a gate electrode on said semiconductor layer with a gate insulating layer therebetween;

doping portions of said semiconductor layer to form source and drain regions;

irradiating said portion of the semiconductor layer with light in order to crystallize said portions or activate dopant impurities contained therein;

wherein said irradiating said portions with light is carried out through a part of a gate insulating layer provided thereon.

4. A method of forming a semiconductor device comprising the steps of:

forming a non-single crystalline semiconductor layer containing a recombination center neutralizer on an insulating surface of a substrate;

forming a gate electrode on said semiconductor layer with a gate insulating layer therebetween;

doping portions of said semiconductor layer to form source and drain regions;

irradiating said portions of the semiconductor layer with light in order to crystallize said portions or activate dopant impurities contained therein;

wherein said doping with an impurity and the irradiation are carried out through a part of said gate insulating layer provided on said portions.

5. The method of claim 1, 3 or 4 wherein said recombination center neutralizer comprises hydrogen or fluorine.

6. The method of claim 1, 3 or 4 wherein said non-single crystalline semiconductor formed on said insulating surface contains said recombination center neutralizer in an amount of 1 atom % or more.

* * * * *